United States Patent
Nandakumar et al.

[19]

[11] Patent Number: 6,150,669

[45] Date of Patent: Nov. 21, 2000

[54] COMBINATION TEST STRUCTURES FOR IN-SITU MEASUREMENTS DURING FABRICATION OF SEMICONDUCTOR DEVICES

[75] Inventors: Mahalingam Nandakumar, Richardson; Greg C. Baldwin, Plano; Andrew T. Appel, Dallas, all of Tex.

[73] Assignee: Texas Instruments Incorporated, Dallas, Tex.

[21] Appl. No.: 09/458,208

[22] Filed: Dec. 9, 1999

Related U.S. Application Data

[60] Provisional application No. 60/112,874, Dec. 18, 1998.

[51] Int. Cl.$^7$ .......................... H01L 23/58; H01L 29/76; H01L 29/94; H01L 31/062; H01L 31/113
[52] U.S. Cl. ........................................... 257/48; 257/401
[58] Field of Search ..................... 257/48, 401; 438/17, 438/18

[56] References Cited

U.S. PATENT DOCUMENTS

| | | | |
|---|---|---|---|
| 5,886,363 | 3/1999 | Hamada et al. | 257/48 |
| 5,962,868 | 10/1999 | Tanida | 257/48 |
| 5,982,042 | 11/1999 | Nakamura et al. | 257/786 |
| 6,031,246 | 2/2000 | Hamada et al. | 257/48 |

*Primary Examiner*—Ngân V. Ngô
*Attorney, Agent, or Firm*—Jacqueline J. Garner; W. James Brady, III; Frederick J. Telecky, Jr.

[57] ABSTRACT

A first test structure (40) is used to measure both the gate resistance/linewidth and transistor performance. A gate line (42) crosses a moat region (44) with source (48) and drain (50) regions formed on either side of the gate line (42). The gate line (42) is connected to four probe pads (52) in an H configuration for accurate linewidth measurements. A second test structure (70) may be used alone or in conjunction with the first test structure. A single gate line (72) crosses a moat region (74) several times. This allows both capacitance and gate gate-resistance measurements with the same test structure and for more accurate TLD measurement.

10 Claims, 3 Drawing Sheets

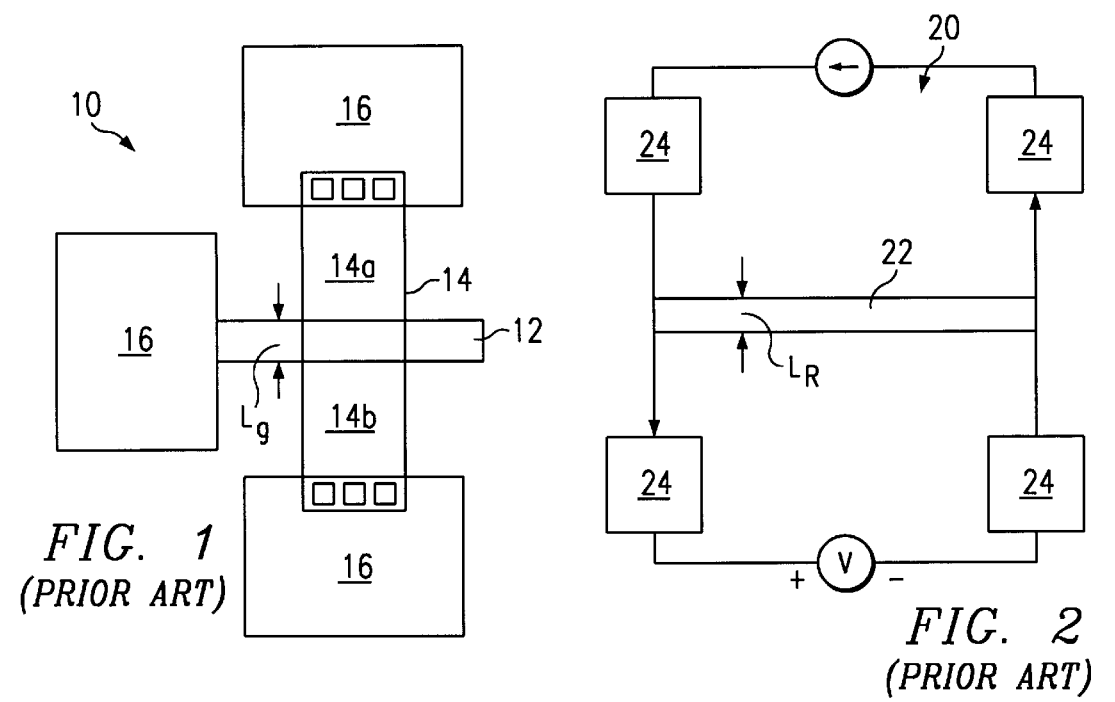
FIG. 1 (PRIOR ART)
FIG. 2 (PRIOR ART)
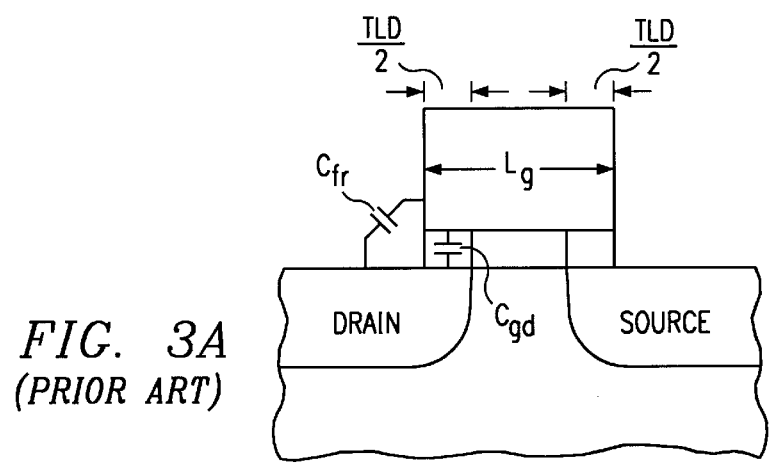
FIG. 3A (PRIOR ART)
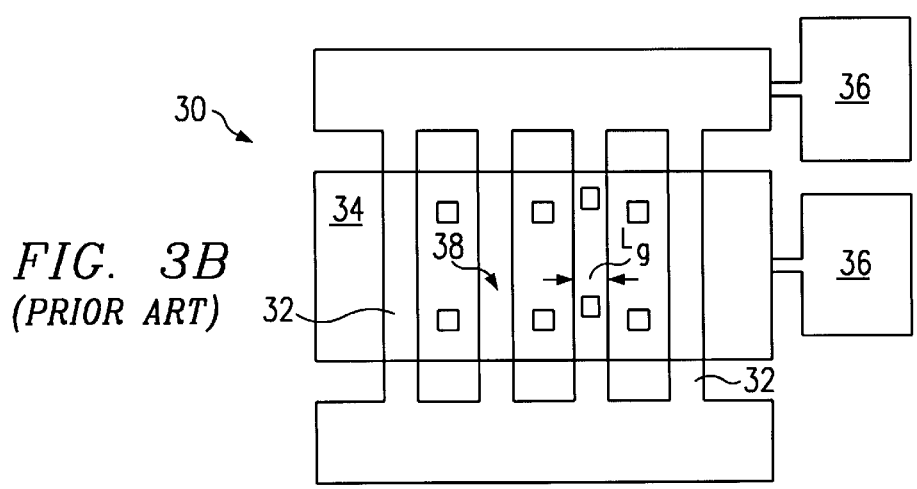
FIG. 3B (PRIOR ART)

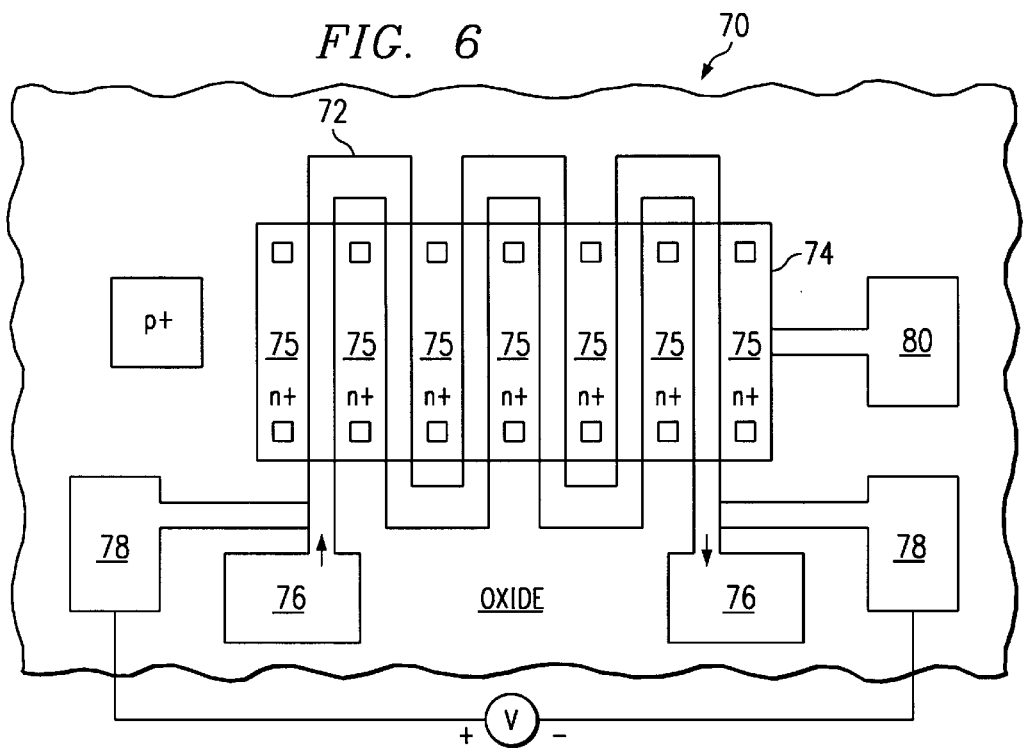
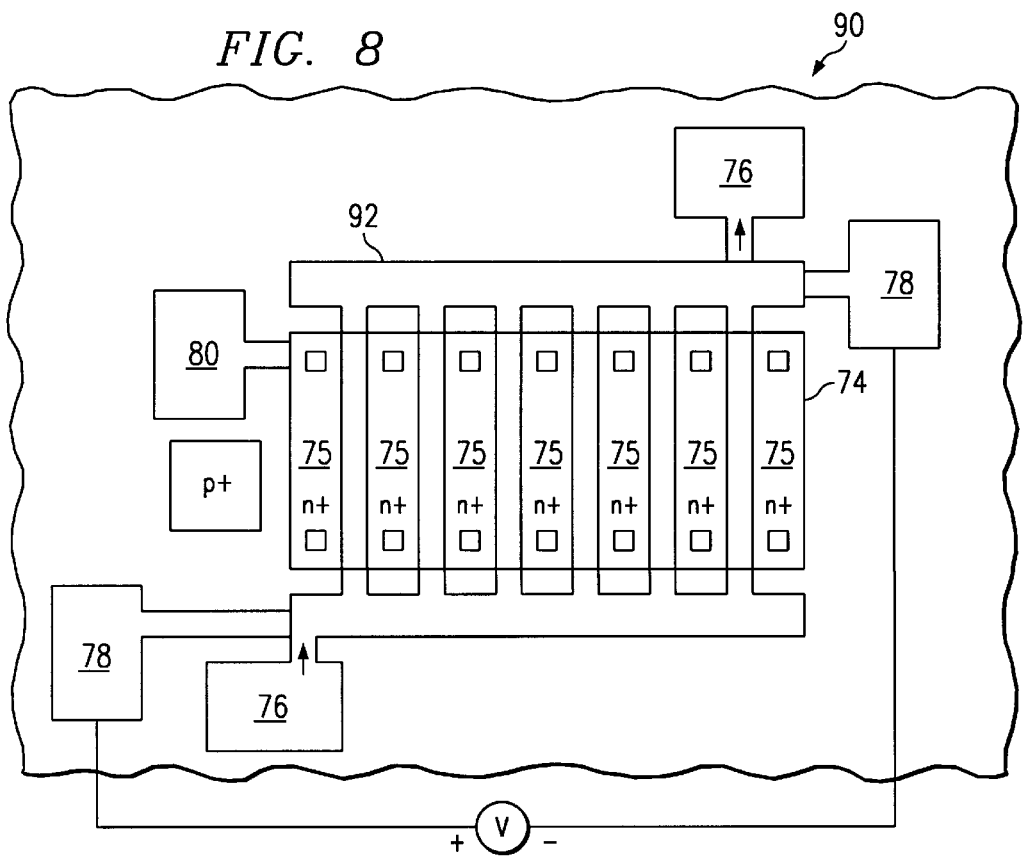

COMBINATION TEST STRUCTURES FOR IN-SITU MEASUREMENTS DURING FABRICATION OF SEMICONDUCTOR DEVICES

This application claims priority under 35 USC 119(e)(1) of provisional application Ser. No. 60/112,874 filed Dec. 18, 1998.

FIELD OF THE INVENTION

The invention is generally related to the field of test structures for semiconductor processing and more specifically to test structures for in-situ measurement during semiconductor processing.

BACKGROUND OF THE INVENTION

There is continual pressure in semiconductor fabrication to reduce the area of a wafer consumed by various semiconductor devices. This is not only true for production integrated circuits (ICs), but also for test structures used to evaluate semiconductor processing and devices. Many test structures are now formed in the scribe lines used to delineate ICs from each other on a wafer. Scribe lines are the lines that are sawed to break up a wafer into the individual ICs. The less area consumed by the scribe lines means more area for active circuitry and possibly more ICs per wafer.

One typical test structure 10 is shown in FIG. 1. Test structure 10 is used to measure transistor performance. The transistor of test structure 10 consists of a polysilicon gate 12 crossing a moat region 14. Moat region 14 consists of source region 14a and drain region 14b. Probe pads 16 are placed adjacent and connect to the gate 12, source region 14a and drain region 14b. The width of the transistor is typically on the order of 10 microns and the length typically ranges from sub-0.1 μm to 0.2 μm. The performance of a transistor is a strong function of gate length. It is important to know the gate length of the transistor being characterized. The gate length is typically measured using top view SEM (scanning electron microscope). However, where several transistors are being characterized over several die of a wafer, SEM becomes time consuming and expensive. Therefore, electrical measurements of resistors made with the same gate material are used to measure gate length. The electrical measurements are accurate and relate well with SEM measurements. A typical test structure to measure resistance is shown in FIG. 2. The structure is essentially a four pad Kelvin structure with two pads to force the current and 2 pads to measure the voltage. Resistance, R, is then determined from the measured voltage and known current. The width of the resistor, $L_R$, is equal to a constant*$P_s$*W/R, where $P_s$ is the sheet resistance of the gate material. The $L_R$ and the gate length are designed to be the same.

This method, however, has inaccuracies because the two test structures (FIG. 1 and FIG. 2) are located in different parts of the die. Although LR is designed to be the same and the gate length, they end up differing by various amounts as they are located on different parts of the wafer.

Another parameter of interest in a transistor is the total lateral diffusion (TLD). FIG. 3A shows a cross-section of a typical transistor. TLD determines how fast a transistor will switch from one state to another, the device current, etc. However, it is difficult to directly measure TLD. Usually it is done by measuring the gate-to-drain capacitance, $C_{gd}$ and subtracting off the fringing component, $C_{fr}$, which is estimated from simulation (and hence, not very accurate).

FIG. 3B shows a prior art test structure used to measure $C_{gd}$ and determine TLD. A series of parallel gate lines 32 cross a moat region 34. Gate lines 32 are connected to each other outside of moat region 34 and connected to a probe pad 36. Moat region 34 is also connected to a probe pad 36. Test structure 30 is typically on the order of 200×200 microns. To determine total capacitance, a SEM at one part, for example region 38, is measured for linewidth. That linewidth is then assumed to be uniform and used to determine the total capacitance.

SUMMARY OF THE INVENTION

A first test structure is disclosed herein that is used to measure both the gate resistance/linewidth and transistor performance. A gate line crosses a moat region with source and drain regions formed on either side of the gate line. The gate line is connected to four probe pads in a Kelvin configuration for accurate linewidth measurements.

A second test structure is also disclosed that may be used alone or in conjunction with the first test structure. The test structure consists of a single serpentine gate line overlying a transistor's active region (moat). The single serpentine gate line is connected in a Kelvin configuration for accurate measurement of gate resistances and gate length. The gate-to-channel capacitance is measured in accumulation and used to calculate $L_{eff}$. The difference between gate length, $L_g$ and $L_{eff}$ gives an accurate value of TLD.

An advantage of the first test structure of the invention is providing a single test structure capable of both transistor performance measurement and gate linewidth measurement. This improves the accuracy of the transistor characterization and said space in the scribe line.

An advantage of the second test structure of the invention is providing a single test structure for both capacitance and gate resistance measurements in order to obtain an accurate $L_g$ and TLD.

This and other advantages will be apparent to those of ordinary skill in the art having reference to the specification in conjunction with the drawings.

BRIEF DESCRIPTION OF THE DRAWINGS

In the drawings:

FIG. 1 is a top-view diagram of a prior art test structure for transistor performance;

FIG. 2 is a top-view diagram of another prior art test structure for polysilicon linewidth measurement;

FIG. 3A is a cross-sectional view of a prior art transistor;

FIG. 3B is a top-view diagram of yet another prior art test structure for capacitance measurement;

FIG. 6 is a top view of a second test structure according to the invention combining gate resistance and capacitance measurements;

FIG. 8 is a top view of an alternative embodiment of the second test structure according to the invention using a mesh gate structure.

DETAILED DESCRIPTION OF THE EMBODIMENTS

The embodiments of the invention are test structures for evaluating semiconductor structures and processes during fabrication. They are generally placed in the scribe lines of a wafer. Because the fabricated structures vary across a wafer (for example, polysilicon linewidth is known to vary across a wafer), the test structures are placed at various locations of the wafer. The test structures are formed using the same process steps as the IC to as closely match the IC structures (i.e., transistors) as possible. The information gained form the test structures is then used to determine such things as whether the fabrication steps have been performed satisfactorily or predict whether the IC transistors will function within their design specifications.

Figure 4:
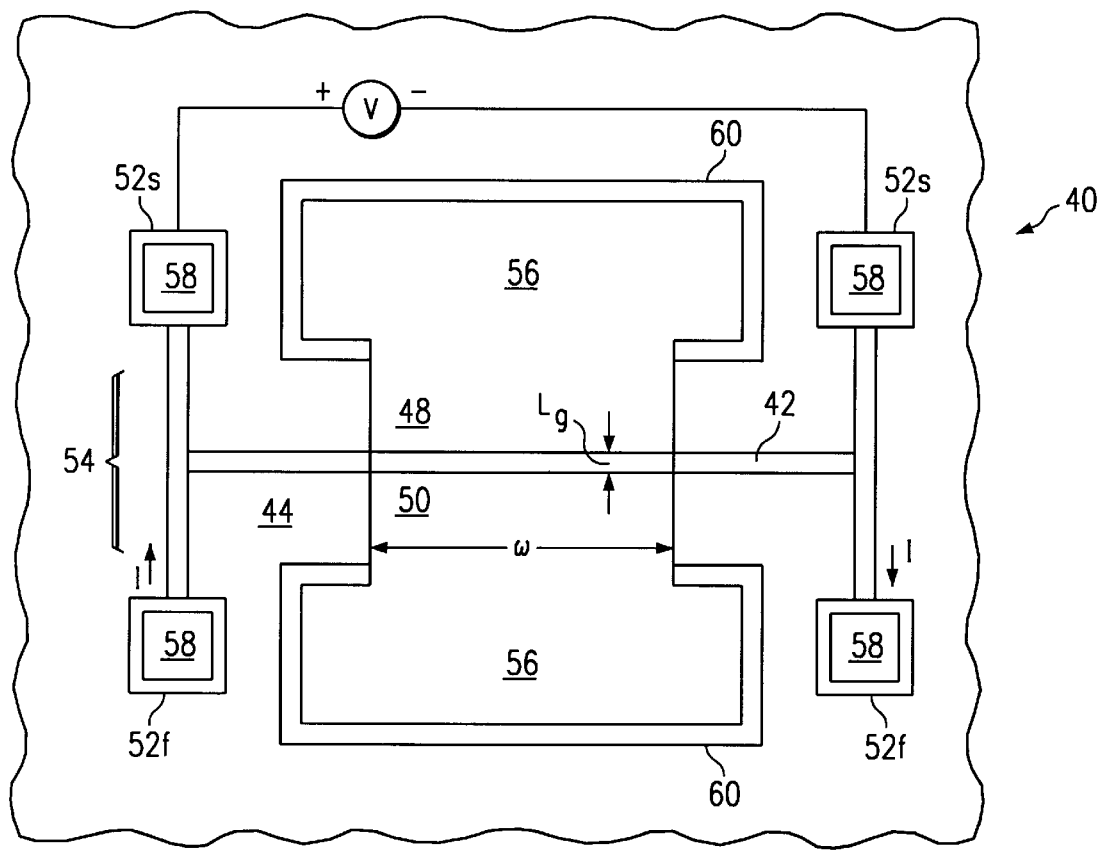
FIG. 4 is a top view of a first test structure according to the invention combining gate resistance and transistor performance measurement.

A first test structure 40 according to the invention is shown in FIG. 4. A gate line 42 crosses from an isolation region 44 to an active area/moat region 46 and back to an isolation region 44 on the other side of the moat region 46. Gate line 42 typically comprises polysilicon, but may additionally or alternatively comprise other suitable gate materials known in the art such as metal (including silicides), or amorphous silicon. (Although not shown, a gate insulator is formed under gate line 42 as in a normal gate structure.) Source 48 and drain 50 regions are then formed in moat region 46 on opposite sides of gate line 42. Source 48, drain 50 and the portion of gate line 42 (and underlying gate insulator) that crosses over moat region 46 form transistor 54.

Connection to transistor 54 is through probe pads 52 and 56. Source region 48 and drain region 50 both extend away from gate line 42 to one of probe pads 56. Gate line 42 is connected to four probe pads 52. Two probe pads 52 are on each side of transistor 54. Probe pads 52 are all equidistant from gate line 42 and are connected in a Kelvin configuration for accurate measurement of resistance. Two probe pads, 52f, are used to force current (I) through gate line 42. The other two probe pads, 52s, are used to sense voltage (V). V/I=R and $L_g$=const $P_s$W/R.

If desired, additional moat regions 58 may be placed under each of probe pads 52. The advantage of moat regions 58 is that any antenna damage that occurs during plasma processing will be distributed amount moat regions 58 and moat region 46 instead of being concentrated at moat region 46. Concentrated antenna damage could impair the gate oxide under gate line 42 resulting in a failed or inaccurate test structure.

Figure 5:
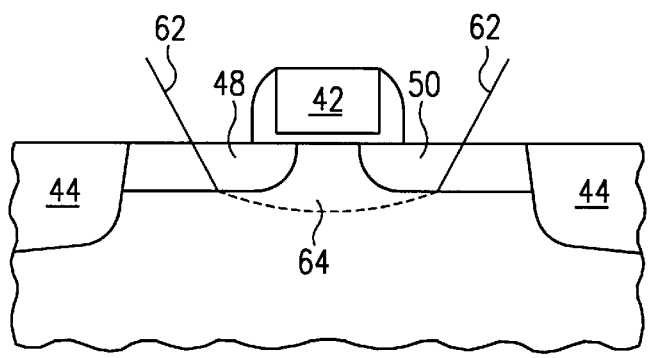
FIG. 5 is a cross-sectional diagram of the first test structure of FIG. 4.

Optional n-well regions 60 may also be placed around the source region 48 and drain region 50 in NMOS transistors. A cross-section of transistor 54 without n-well regions 60 is shown in FIG. 5. When source region 48 and drain region 50 are probed during testing, it is possible for the probes 62 to extend through the shallow source and drain regions 48 and 50. This results in a short between the probes 62 as both are connected to the p-type region 64. Placing an n-well region 66 below the source and drain regions 48 and 50 keeps the probes 62 from shorting out.

Transistor performance is measured in a manner similar to the prior art test structure. An advantage is that gate resistance and thus linewidth is measured in-situ on the transistor itself. Thus, an accurate linewidth measurement for the transistor is obtained. On contrast, the prior art used separate test structures spaced apart from each other. Linewidth varies across a wafer. Therefore, the resistance/linewidth measured does not necessarily match the linewidth on the transistor gate. Transistor performance is strongly dependent on linewidth. Therefore, the variation in linewidth between that measured on the gate resistance test structure and that of the transistor test structure could result in inaccurate transistor performance calculations. In the first test structure according to the invention, the resistance of the transistor gate line is measured and the transistor gate linewidth determined. Thus, the transistor gate width can accurately be used in determining transistor performance.

Another manner in which the first test structure 40 provides a more accurate measure of the gate line is that gate line 42 crosses from an isolation region 44 to moat region 46 and back just as in the transistors being emulated. The prior art gate resistance test structure was formed entirely over the field (or isolation region). Thus, the crossover portion of a gate line was not accurately indicated.

Another advantage of the first test structure is that less scribe area is consumed. The prior art required two separate test structures (one for transistor performance and one for gate resistance) to accomplish, in a less accurate manner, what the first test structure can accomplish by itself. Thus, the scribe line can potentially be narrower since the total number of required probe pads in the scribe line is reduced, resulting in a shorter total scribe length. If scribe line test modules are too long, the scribe line has to be double or triple wide.

A second test structure 70 according to the invention is shown in FIG. 6. Second test structure 70 is used to measure capacitance and resistance. The second test structure 70 may be used alone or in conjunction with the first test structure 40. The test structure 70 consists of a single serpentine gate line 72 overlying a transistor's active region (moat) 74. Single serpentine gate line 72 has a long linear linewidth (~200 $\mu$m). Gate line 42 typically comprises polysilicon, but may additionally or alternatively comprise other suitable gate materials known in the art such as metal (including silicides), or amorphous silicon. As in the first test structure a gate insulator (not shown) is formed under gate line 72. Source/drain regions 75 are formed in moat region 74. Moat region 74 is connected to probe pad 80.

The single serpentine gate line 72 is connected to probe pads 76 in a Kelvin configuration for accurate measurement of gate resistances and gate length. As described earlier, two probe pads, 76f, are used to force current (I) through gate line 72. The other two probe pads, 76s, are used to sense voltage (V). V/I=R and $L_g$=const $P_s$W/R.

Figure 7:
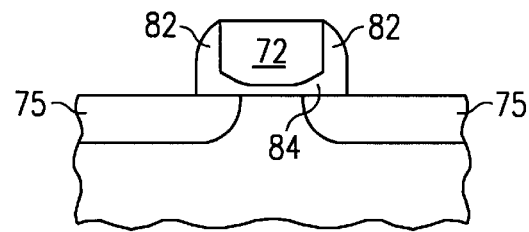
FIG. 7 is a cross-sectional diagram of the second test structure of FIG. 6.

A cross-section of a portion of test structure 70 is shown in FIG. 7. Spacers 82 are formed on the sidewalls of gate line 72 and smile oxidation is performed creating a thicker oxide 84 at the edges under gate line 72. The amount of overlap between the gate and drain alters the transistor performance by reducing the effective gate length, $L_{eff}$. Thus, the amount of overlap needs to be known for accurate transistor characterization. The gate-to-channel capacitance is measured in accumulation and used to calculate $L_{eff}$. The difference between gate length, $L_g$ and $L_{eff}$ gives an accurate value of TLD.

Another advantage of the test structure 70 is that is can be used to accurately extract the sidewall junction capacitance. The open areas of moat 75 between portions of serpentine gate line 72 can be determined once gate length has been measured. Since the pitch is known, the gate length can be subtracted from the pitch to give the width of the open areas. The smaller the opening, the more perimeter area there is for sidewall capacitance and the higher the ratio of sidewall capacitance to bottom capacitance.

In an alternative embodiment, the serpentine gate line 72 of the second embodiment could be replaced with a mesh gate structure 92 as shown in FIG. 8. The mesh gate structure 92 is connected to probe pads 76 and 78 in a Kelvin configuration as shown. The structure 90 is also used to measure gate length, determine TLD and extract sidewall junction capacitance in a manner similar to test structure 70.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A test structure comprising:

a first moat region located in a semiconductor body;

an isolation region surrounding said moat region;

a gate line crossing over said moat region, said gate line connected to at least four probe pads;

a source region and a drain region formed in said moat region on opposite sides of said gate line.

2. The test structure of claim 1, wherein said gate line and said four probe pads are connected in a Kelvin configuration.

3. The test structure of claim 1, wherein said gate line crosses from over said isolation region to over said moat region.

4. The test structure of claim 1, wherein said source region and said drain region are each connected to a probe pad.

5. The test structure of claim 4, further comprising:

a first well region located in said semiconductor body under said source region; and a second well region located in said semiconductor body under said drain region, said first and second well region having the same conductivity type as said source and drain regions.

6. The test structure of claim 1, further comprising a plurality of second moat regions each located under each of said at least four probe pads.

7. A test structure comprising:

a moat region located in a semiconductor body;

a serpentine gate line crossing over said moat region, said serpentine gate line connected to a probe pad at each end;

source/drain regions located in said moat regions adjacent said serpentine gate line.

8. The test structure of claim 7, wherein said moat region is connected to a probe pad.

9. The test structure of claim 7, wherein said gate line is also connected in a Kelvin configuration.

10. The test structure of claim 7, wherein said serpentine gate line is connected together at each end to form a mesh structure.

* * * * *